(12) United States Patent
Kato

(10) Patent No.: US 7,362,649 B2
(45) Date of Patent: *Apr. 22, 2008

(54) MEMORY CONTROL DEVICE AND MEMORY CONTROL METHOD

(75) Inventor: Yoshiharu Kato, Kasugai (JP)

(73) Assignee: Fujitsu Limited, Kawasaki (JP)

( * ) Notice: Subject to any disclaimer, the term of this patent is extended or adjusted under 35 U.S.C. 154(b) by 0 days.

This patent is subject to a terminal disclaimer.

(21) Appl. No.: 11/640,906

(22) Filed: Dec. 19, 2006

(65) Prior Publication Data

US 2007/0097776 A1    May 3, 2007

Related U.S. Application Data

(62) Division of application No. 10/850,113, filed on May 21, 2004, now Pat. No. 7,158,437.

(30) Foreign Application Priority Data

Dec. 19, 2003    (JP) .............................. 2003-422948

(51) Int. Cl.
*G11C 8/00*    (2006.01)
(52) U.S. Cl. ............... 365/230.03; 365/63; 365/189.05
(58) Field of Classification Search ........... 365/230.03, 365/63, 189.05
See application file for complete search history.

(56) References Cited

U.S. PATENT DOCUMENTS

| 6,477,671 B2 | 11/2002 | Wada et al. |
| 6,704,237 B2 | 3/2004 | Park |
| 6,807,109 B2 * | 10/2004 | Tomishima ............ 365/189.05 |

* cited by examiner

*Primary Examiner*—Huan Hoang
(74) *Attorney, Agent, or Firm*—Arent Fox LLP

(57) ABSTRACT

There is provided memory control device and memory control method, which can prevent wiring complication by many crossing wirings, and reduction of yield and quality. When a memory control device CC1 selects a memory chip CC2, an internal circuit of a select circuit 27 is changed by a switch signal SWS2. In this case, the changeover is made so that a select signal S2 outputted from an internal circuit 40 is inputted to a predetermined memory terminal of the memory chip CC2. The select signal S2 is inputted to the corresponding predetermined memory terminal of the memory chip CC2, and thereby, the memory chip CC2 is activated, and set to a state capable of inputting and outputting control signals 21 to 25. The control signals 21 to 25 are assigned to control terminals P21 to P27 after being hanged by the select circuit 27 in signal sequence corresponding to terminal array sequence of memory terminals 21a to 27a of the memory chip CC2.

13 Claims, 12 Drawing Sheets

PRINCIPLE OF PRESENT INVENTION

PRINCIPLE OF PRESENT INVENTION

SCHEMATIC DIAGRAM OF MEMORY CONTROL DEVICE AND MEMORY CHIPS DIRECTED TO FIRST EMBODIMENT

SCHEMATIC DIAGRAM OF MEMORY CONTROL DEVICE DIRECTED TO SECOND EMBODIMENT

SCHEMATIC DIAGRAM OF ASSIGNMENT INFORMATION RECORDING CIRCUIT SR

CIRCUIT DIAGRAM OF MEMORY SECTION IN ASSIGNMENT INFORMATION RECORDING CIRCUIT IN FIG.4A

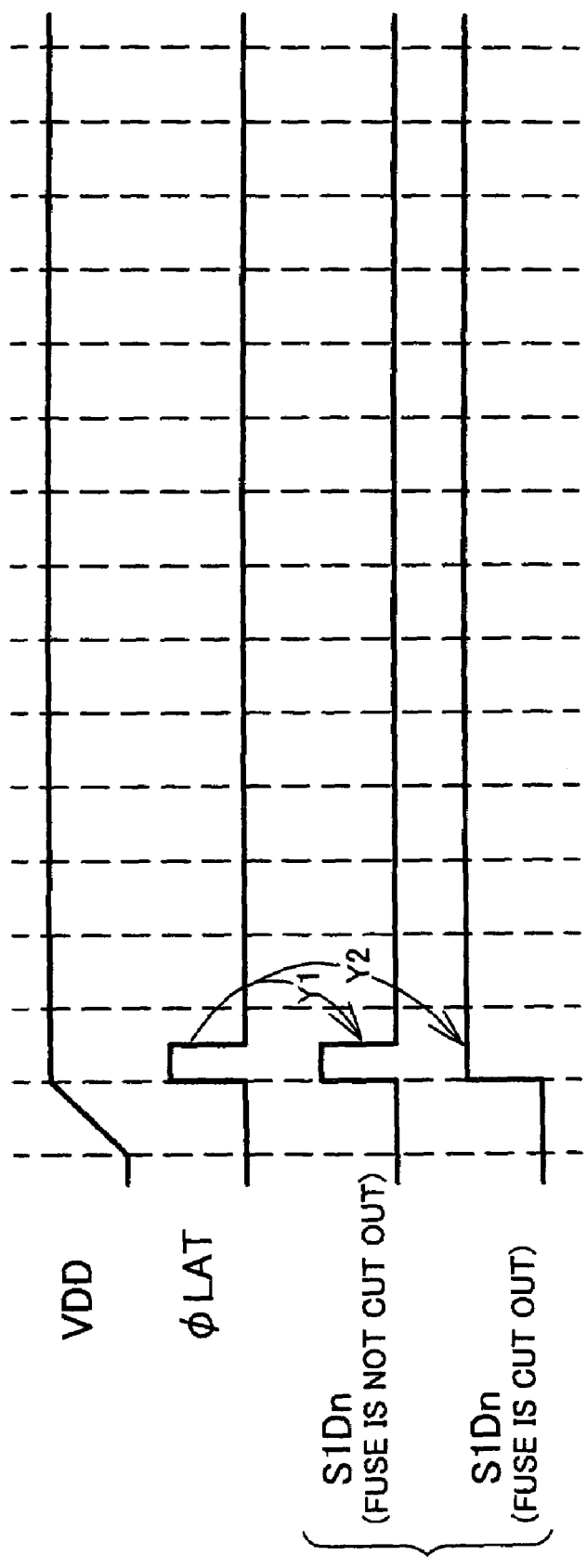

CIRCUIT DIAGRAM OF MEMORY SECTION IN ASSIGNMENT
INFORMATION RECORDING CIRCUIT OF FIG.6A

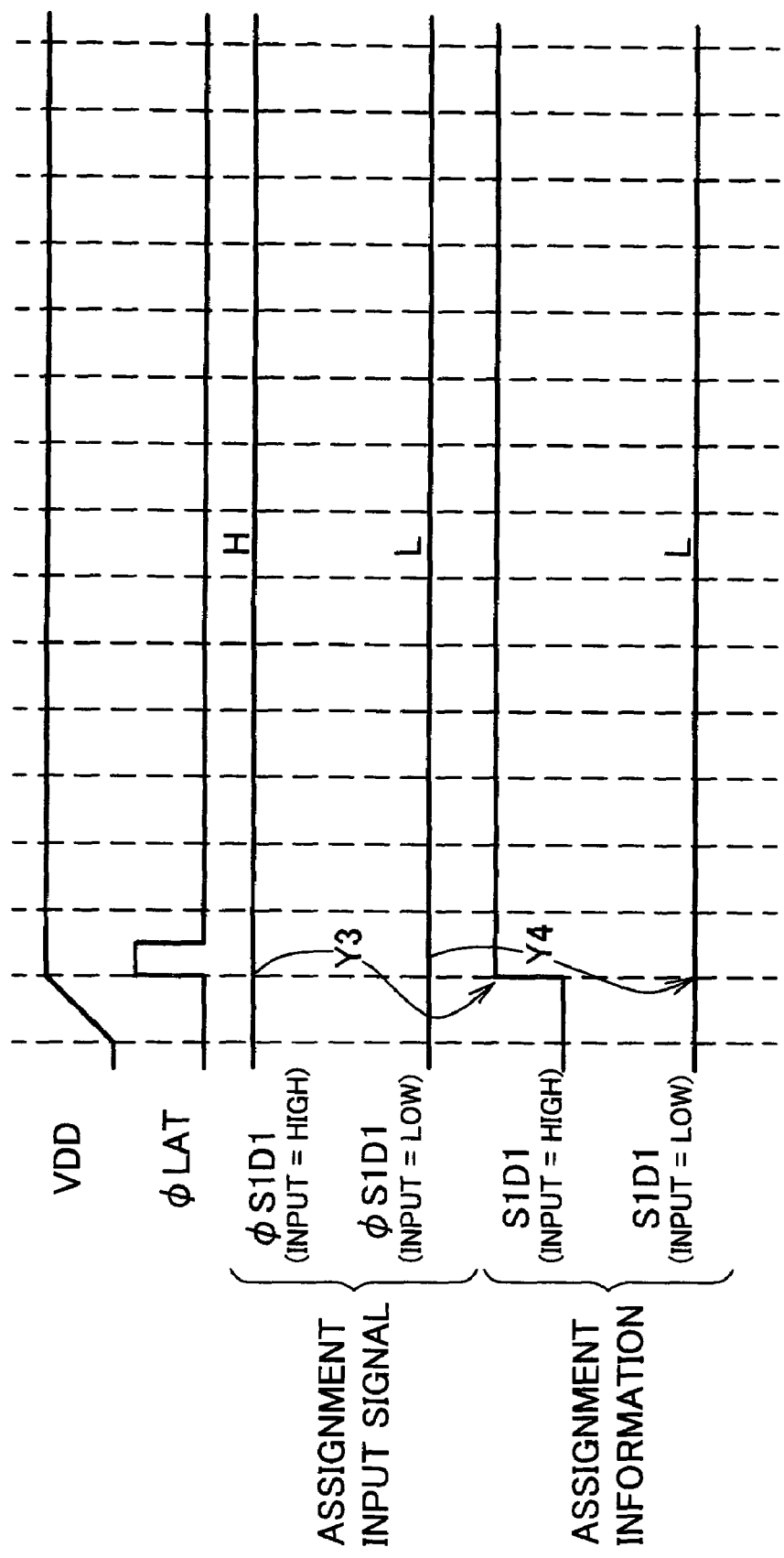

ANOTHER STRUCTURAL EXAMPLE OF MEMORY CONTROL DEVICE C1a

CIRCUIT DIAGRAM OF VOLTAGE VARIABLE DRIVER SECTION VD DIRECTED TO THIRD EMBODIMENT

CIRCUIT DIAGRAM OF VOLTAGE VARIABLE DRIVER SECTION VDR DIRECTED TO FOURTH EMBODIMENT

STRUCTURAL EXAMPLE OF POWER GENERATOR SECTION 29

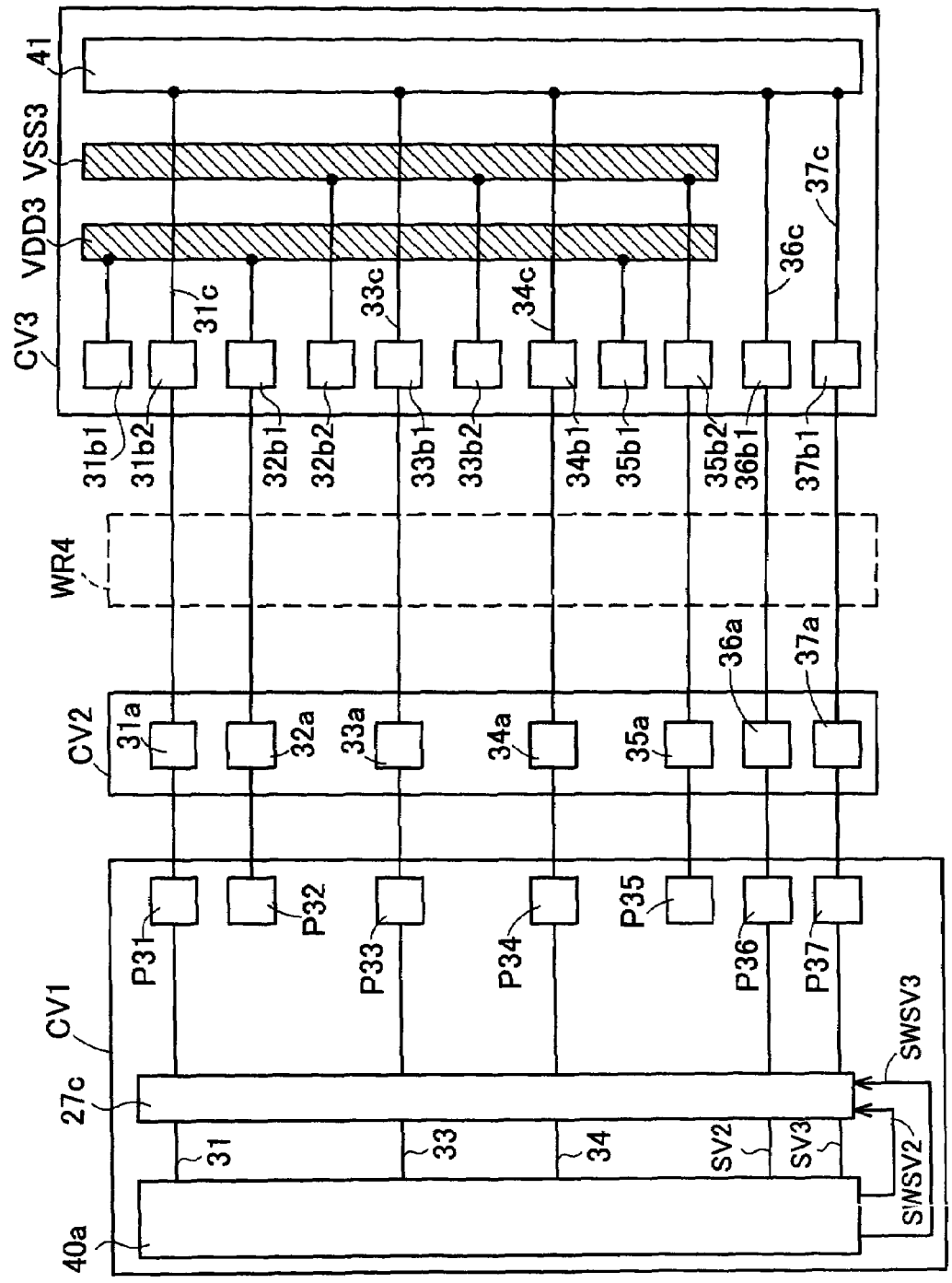
FIG. 11 SCHEMATIC DIAGRAM OF MEMORY CONTROL DEVICE AND MEMORY CHIPS DIRECTED TO FIFTH EMBODIMENT

ELECTRICAL SCHEMATIC DIAGRAM OF CONVENTIONAL WIRING AMONG CHIPS

MEMORY CONTROL DEVICE AND MEMORY CONTROL METHOD

CROSS-REFERENCE TO RELATED APPLICATIONS

This is a Divisional Application, which claims the benefit of pending of U.S. patent application No. 10/850,113, filed May 21, 2004 now U.S. Pat. No. 7,158,437. The disclosure of the prior application is hereby incorporated herein in its entirety by reference.

BACKGROUND OF THE INVENTION

1. Field of the Invention

The present invention relates to connection of semiconductor device. More specifically, it relates to a memory control device and memory control method free from complication of wiring.

2. Description of Related Art

In semiconductor device field in recent years, miniaturization of portable electric appliances has promoted increase of multi chip package and system in package, wherein plural chips are mounted on a single package. In those packages, plural chips are built in a single package. Therefore, heat and power noises occur at plural packages and wiring connection among chips in a package has been complicated.

Conventionally, there have been used interposer chips as shown in FIG. 12 for wiring connection among chips in a package. FIG. 12 shows a case that three chips are sealed in a package 200. Terminal positioning of a chip 201 is set to meet connection with a chip 202. Therefore, there is no point at which connection wirings of the chip 201 and the chip 202 cross. However, there is used an interposer chip 204 for connecting the chip 201 and a chip 203 of which terminal positioning differs from that of the chip 202. Wiring order on the interposer chip 204 is changed and the chip 201 and the chip 203 are connected through the chip 202 and the interposer chip 204.

SUMMARY OF THE INVENTION

As to the conventional package, connection using an interposer chip makes packaging efficient poor and makes packaging area large, which is problematic. Furthermore, since the number of parts increases, there is a fear that yield and quality of packages degrades, which is problematic. Furthermore, there is also a fear of cost-up due to increase in the number of parts and manufacturing steps, which is problematic. Furthermore, in case a chip other than the chip 203 is desired to combine with the chip 201 and the chip 203, it is required to design another interposer chip, which causes increase of cost. On the other hand, in case an interposer chip is not used for wiring among chips, the number of cross points on wiring increases and wiring gets complicated, which results in degrade of yield and quality as well as cost-up.

The present invention has been made to resolve at lease one of the above-mentioned problems. Accordingly, the present invention provides a memory control device and memory control method capable of avoiding increase in the number of crossing points on wiring, complication of wiring, and degrade of yield and quality.

According to one aspect of the present invention, as inventive device, there is provided a memory control device for controlling a plurality of semiconductor memory devices selected by at least one select signal(s), the memory control device comprising: a plurality of control terminals to which/from which at least one of signals, either at least one control signal(s) or at least one select signal(s) both for the semiconductor memory devices, is inputted/outputted, the plurality of control terminals being connected to a plurality of memory terminals provided for respective semiconductor memory devices in common; and a select circuit for switching assignment of at least one of signals, either the control signal(s) or the select signal(s) both for the control terminals, depending on the select signal(s), along with terminal arrangement order of the plurality of memory terminals for semiconductor memory device(s) to be selected.

Furthermore, according to the one aspect of the present invention, as inventive method, there is also provided memory control method for controlling a plurality of semiconductor memory devices selected by at least one select signal(s), the memory control, the memory control method comprising: inputting/outputting at least one of signals, either at least one control signal(s) or at least one select signal(s) both for the semiconductor memory devices, to/from a plurality of control terminals which are connected to a plurality of memory terminals provided for respective semiconductor memory devices in common; and switching assignment of at least one of signals, either the control signal(s) or the select signal(s) both for the control terminals, depending on the select signal(s) along with terminal arrangement order of the plurality of memory terminals for semiconductor memory device(s) to be selected.

At least either one of signals, namely, a control signal for a semiconductor memory device or a select signal, is inputted/outputted to the control terminal. The select signal selects a semiconductor memory device to be control. In the select circuit or the step of switching assignment, assignment of at least either one of the control signal or the select signal is switched depending on the select signal, along with terminal arrangement order of memory terminals for semiconductor memory device(s) to be selected.

Thereby, at least either one of the control signal or the select signal inputted/outputted from an internal circuit or the like in the memory control device can be set in signal order in accordance with terminal arrangement order of memory terminals for semiconductor memory device(s) to be selected by the select circuit or the step of switching assignment. Accordingly, there can be avoided crossing of wirings in a wiring region for connecting a memory control device and a semiconductor memory device and in a wiring region for connecting semiconductor memory devices without using an interposer chip. There can be thus avoided complication of wiring, degrade of yield and quality, and cost-up due to increase in the number of parts and manufacturing steps.

The above and further novel features of the invention will more fully appear from the following detailed description when the same is read in connection with the accompanying drawings. It is to be expressly understood, however, that the drawings are for the purpose of illustration only and are not intended as a definition of the limits of the invention.

BRIEF DESCRIPTION OF THE DRAWINGS

FIG. 5 is a timing chart of the assignment information recording circuit SR;

FIG. 7 is a timing chart of assignment information recording circuit SR (second structural example);

FIG. 8 shows another structural example of a memory control device C1a;

FIG. 11 is a schematic diagram of a memory control device and memory chips directed to a fifth embodiment.

DETAILED DESCRIPTION OF THE PREFERRED EMBODIMENTS

Figure 1:
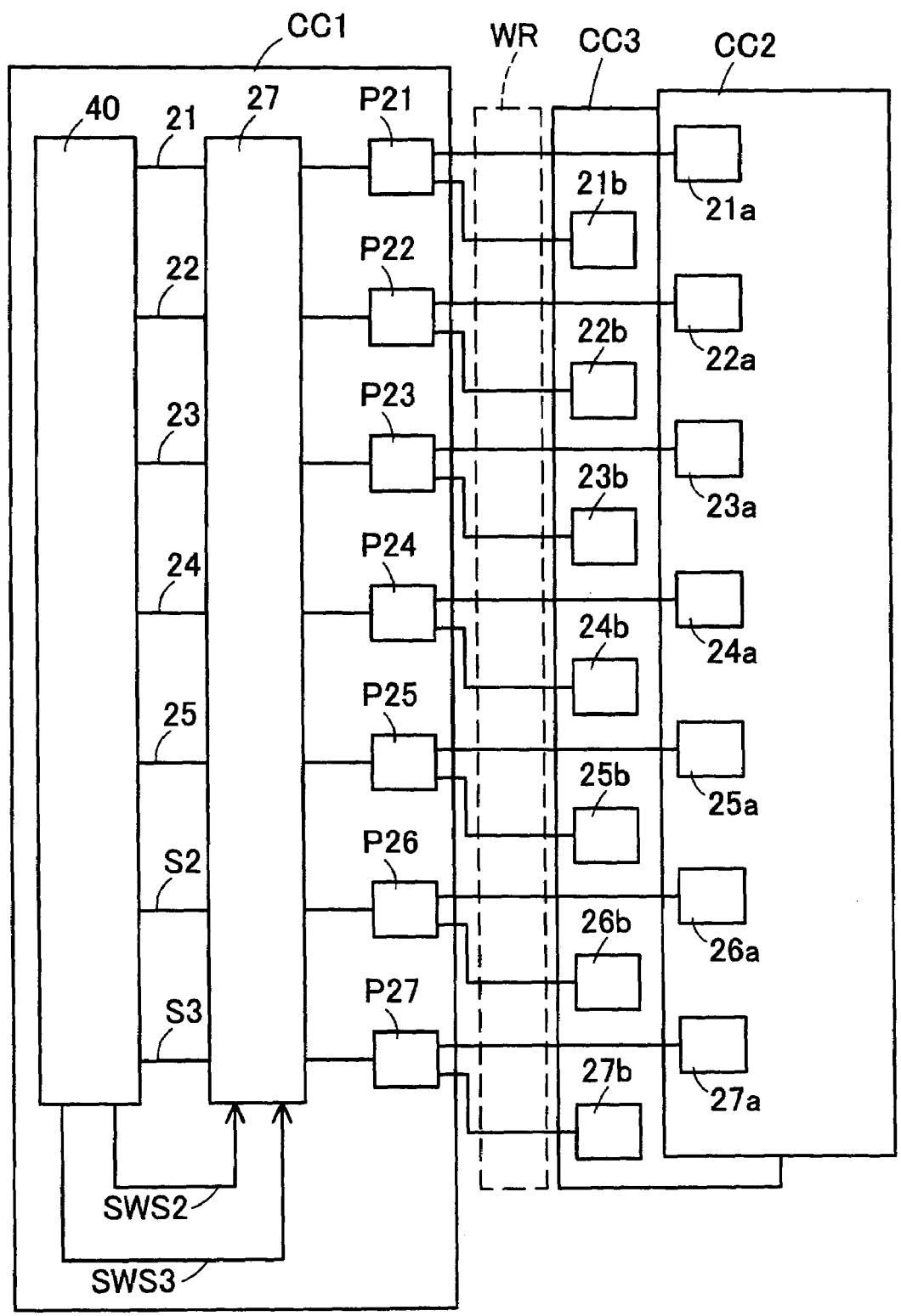
FIG. 1 is a diagram showing principle of the present invention.

The preferred embodiments of memory control device and control method according to the present invention will be fully described below with reference to the accompanying drawings, that is, FIG. 1 to FIG. 11. FIG. 1 is a view to explain the principle of the present invention. In FIG. 1, control terminals P21 to P27 of a memory control device CC1 are connected to memory terminals 21a to 27a of a memory chip CC2 and memory terminals 21b to 27b of a memory chip CC3. The memory control device CC1 includes a select circuit 27. The control terminals P21 to P27 input and output control signals 21 to 25, select signals S2 and S3 inputted/outputted from an internal circuit 40 via the select circuit 27. Switch signals SWS2 and SWS3 are outputted from the internal circuit 40, and thereafter, inputted to the select circuit 27. The switch signal SWS2 is a signal for making a changeover of the internal circuit of the select circuit 27. In this case, the changeover is made so that the select signal S2 for activating the memory chip CC2 can be inputted to a predetermined memory terminal of the memory chip CC2. Likewise, the switch signal SWS3 is a signal for a changeover of the internal circuit of the select circuit 27. In this case, the changeover is made so that the select signal S3 for activating the memory chip CC3 can be inputted to a predetermined memory terminal of the memory chip CC3. Incidentally, the memory chip is given as one example of a semiconductor memory device.

When the memory control device CC1 selects the memory chip CC2, the internal circuit of select circuit 27 is changed over by the switch signal SWS2. In this case, the changeover is made so that the select signal S2 outputted from the internal circuit 40 is inputted to a predetermined memory terminal of the memory chip CC2. The select signal S2 is inputted to the corresponding predetermined memory terminal of the memory chip CC2 via the select circuit 27. By doing so, the memory chip CC2 is activated to provide a state capable of inputting and outputting control signals 21 to 25. The control signals 21 to 25 are changed over by the select circuit 27 in signal sequence corresponding to terminal array sequence of memory terminals 21a to 27a of the memory chip CC2. Thereafter, these control signals 21 to 25 are assigned to control terminals P21 to P27.

Likewise, when the memory chip CC3 is selected, the internal circuit of select circuit 27 is changed over by the switch signal SWS3. In this case, the changeover is made so that the select signal S3 outputted from the internal circuit 40 can be inputted to a predetermined memory terminal of the memory chip CC3. The select signal S3 is inputted to the corresponding predetermined memory terminal of the memory chip CC3 via the select circuit 27. By doing so, the memory chip CC3 is activated to provide a state capable of inputting and outputting control signals 21 to 25. The control signals 21 to 25 are changed over by the select circuit 27 in signal sequence corresponding to terminal array sequence of memory terminals 21b to 27b of the memory chip CC3. Thereafter, these control signals 21 to 25 are assigned to control terminals P21 to P27.

As described above, the memory control device CC1 controls memory chips CC2 and CC3 selected in accordance with select signals S2 and S3. In this case, control signals 21 to 25, select signals S2 and S3 outputted from control terminals P21 to P27 are assigned in the following manner. These signals are assigned to match the signal sequence of memory terminals 21a to 27a and 21b to 27b of memory chips CC2 and CC3 in accordance with switch signals SWS2 and SWS3. Therefore, it is possible to prevent wirings (interconnections) of a wiring region WR connecting the memory chip CC1 to the memory chips CC2 and CC3 from crossing. Consequently, this serves to prevent complication of the wirings, and to avoid a reduction of yield or quality and high cost by an increase of components and processes.

Figure 2:
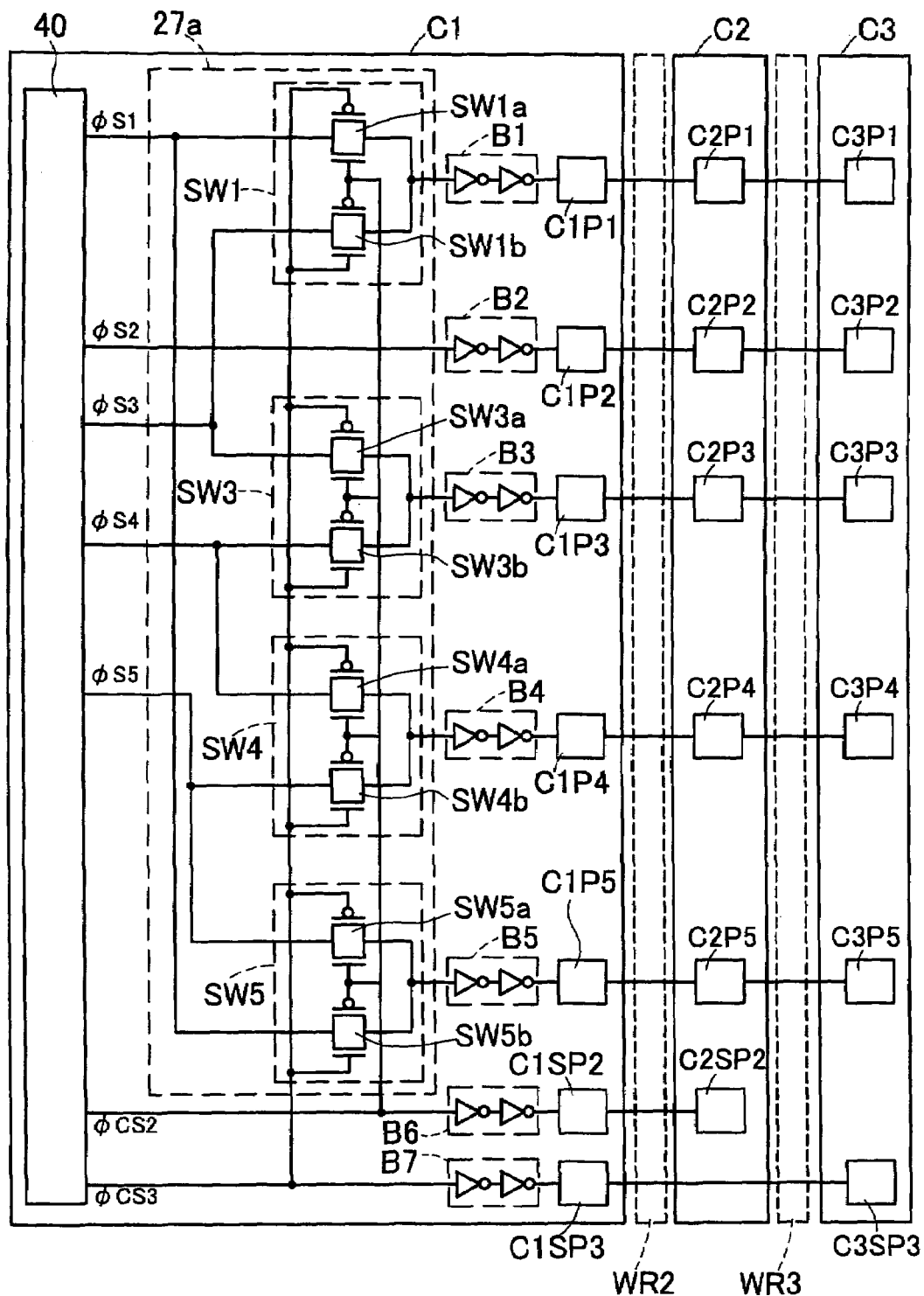
FIG. 2 is a schematic diagram of a memory control device and memory chips directed to a first embodiment.
Figure 3:
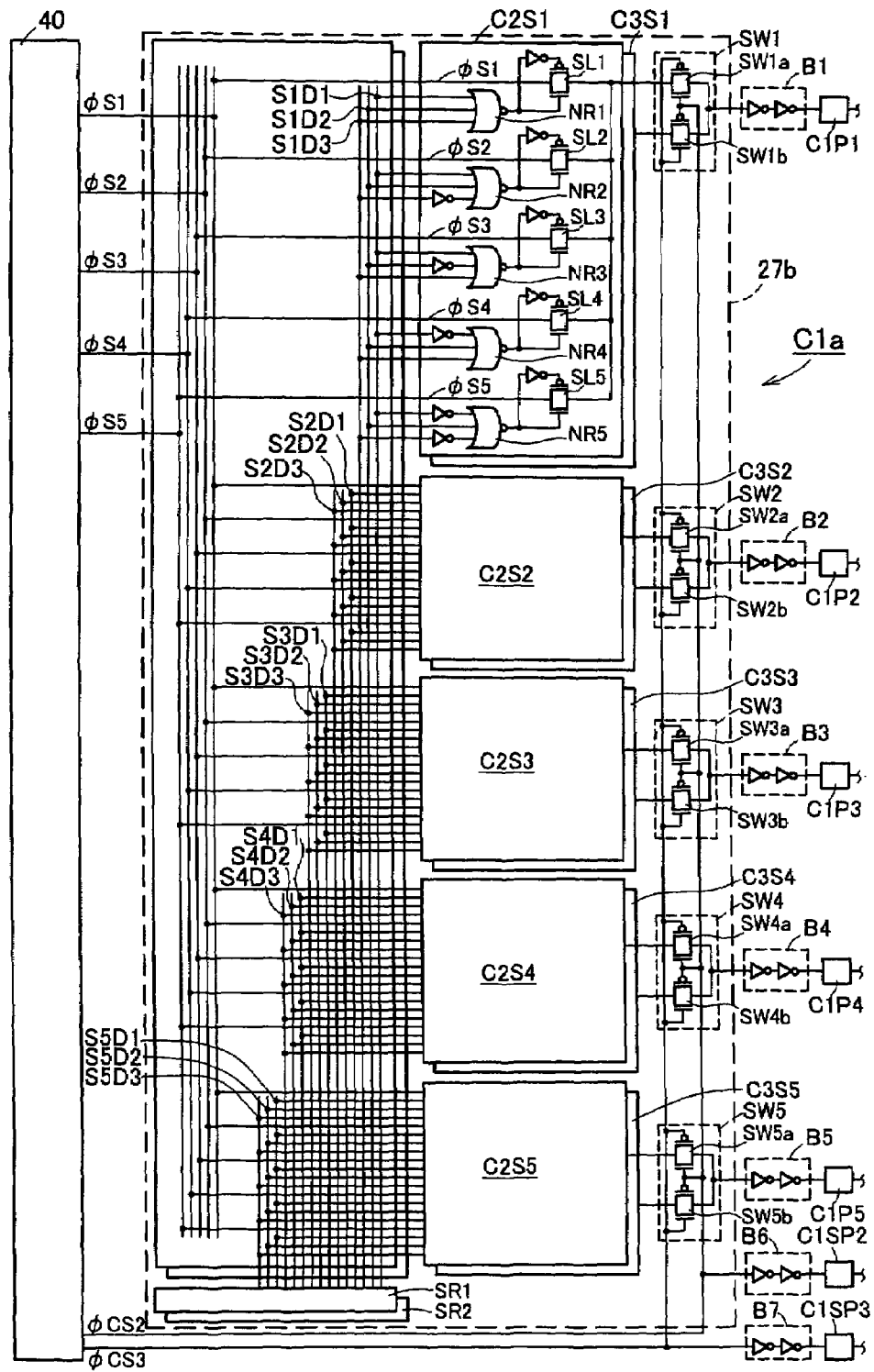
FIG. 3 is a schematic diagram of a memory control device directed to a second embodiment.

The first embodiment of the present invention will be described below with reference to FIG. 2. A memory control device C1 includes control terminals C1P1 to C1P5, terminals C1SP2 and C1SP3. Likewise, a memory chip C2 includes memory terminals C2P1 to C2P5 and C2SP2; on the other hand, a memory chip C3 includes memory terminals C3P1 to C3P5 and C3SP3. The control terminal C1P1 of the memory control device C1 is connected to the memory terminal C2P1 of the memory chip C2. Further, the control terminal C1P1 is connected to the memory terminal C3P1 of the memory chip C3 via the memory terminal C2P1. Likewise, the control terminal C1P2 of the memory control device C1 is connected to the memory terminal C2P2 of the memory chip C2. Further, the control terminal C1P2 is connected to the memory terminal C3P2 of the memory chip C3 via the memory terminal C2P2. The control terminal C1P3 of the memory control device C1 is connected to the memory terminal C2P3 of the memory chip C2. Further, the control terminal C1P3 is connected to the memory terminal C3P3 of the memory chip C3 via the memory terminal C2P3. The control terminal C1P4 of the memory control device C1 is connected to the memory terminal C2P4 of the memory chip C2. Further, the control terminal C1P4 is connected to the memory terminal C3P4 of the memory chip C3 via the memory terminal C2P4. The control terminal C1P5 of the memory control device C1 is connected to the memory terminal C2P5 of the memory chip C2. Further, the control terminal C1P5 is connected to the memory terminal C3P5 of the memory chip C3 via the memory terminal C2P5. The terminal C1SP2 of the memory control device C1 is connected with the memory terminal C2SP2 of the memory chip C2. The terminal C1SP3 of the memory control device C1 is connected with the memory terminal C3SP3 of the memory chip C3.

The memory control device C1 includes switch circuits SW1 and SW3 to SW5, which individually input control signals ΦS1 and ΦS3 to ΦS5 outputted from the internal circuit 40. A select circuit 27a is composed of the foregoing switch circuits SW1 and SW3 to SW5. Control signals ΦS1 to ΦS5 are, for example, low address strobe signal /RAS, column address strobe signal /CAS, write enable signal /WE, address signal ADD, clock enable signal CKE, respectively. The control signal ΦS1 is inputted to a switch SW1a of the switch circuit SW1 and a switch SW5b of the switch circuit SW5. The control signal ΦS3 is inputted to a switch SW3a of the switch circuit SW3 and a switch SW1b of the switch circuit SW1. The control signal ΦS4 is inputted to a switch SW4a of the switch circuit SW4 and a switch SW3b of the switch circuit SW3. The control signal ΦS5 is inputted to a switch SW5a of the switch circuit SW5 and a switch SW4b of the switch circuit SW4. The output node of the switches SW1a and SW1b is connected to the control terminal C1P1 via a buffer B1. Likewise, the output node of the switches SW3a and SW3b is connected to the control terminal C1P3 via a buffer B3. The output node of the switches SW4a and SW4b is connected to the control terminal C1P4 via a buffer B4. The output node of the switches SW5a and SW5b is connected to the control terminal C1P5 via a buffer B5. The control signal ΦS2 outputted from the internal circuit 40 is inputted to the control terminal C1P2 via the buffer B2 without being inputted to switch circuits.

The internal circuit 40 of the memory control device C1 generates select signals ΦCS2 and ΦCS3 for selecting controlled object chip. The select signal ΦCS2 is inputted to each gate of NMOS transistors included in SW1a and SW3a to SW5a and each gate of PMOS transistors included in SW1b and SW3b to SW5b. Likewise, the select signal ΦCS3 is inputted to each gate of PMOS transistors included in SW1a and SW3a to SW5a and each gate of NMOS transistors included in SW1b and SW3b to SW5b. In addition, the select signal ΦCS2 is inputted to the terminal C1SP2 via a buffer B6; on the other hand, the select signal ΦCS3 is inputted to the terminal C1SP3 via a buffer B7. The memory chip C2 is a memory chip, which has setting conditions that control signals ΦS1 to ΦS5 must be inputted to memory terminals C2P1 to C2P5, respectively. The memory chip C3 is a memory chip, which has setting conditions that control signals ΦS3, ΦS2, ΦS4, ΦS5 and ΦS1 must be inputted to memory terminals C3P1 to C3P5, respectively.

The memory control device C1 controls the memory chip C2. In this case, the internal circuit 40 of the memory control device C1 generates high-level select signal ΦCS2 and low-level select signal ΦCS3. The high-level select signal ΦCS2 is inputted to the memory terminal C2SP2 of the memory chip C2 via buffer B6 and terminal C1SP2, and thereby, the internal circuit of the memory chip C2 can be activated. By doing so, a state capable of inputting and outputting each control signal is given. In this case, the select signal ΦCS3 inputted to the memory terminal C3SP3 of the chip C3 is low level; therefore, the internal circuit of the memory chip C3 is not activated. As a result, the internal circuit of the memory chip C3 is set in a standby mode or input/output of each control signal. Simultaneously, high-level select signal ΦCS2 and low-level select signal ΦCS3 are inputted to switch circuits SW1, SW3, SW4 and SW5. By doing so, switches SW1a, SW3a, SW4a and SW5a are in a conductive state; on the other hand, switches SW1b, SW3b, SW4b and SW5b are in a non-conductive state. Thus, the control signal ΦS1 is inputted to the memory terminal C2P1 of the activated memory chip C2 via switch SW1a, buffer B1 and control terminal C1P1. Likewise, the control signal ΦS3 is inputted to the memory terminal C2P3 via switch SW3a, buffer B3 and control terminal C1P3. The control signal ΦS4 is inputted to the memory terminal C2P4 via switch SW4a, buffer B4 and control terminal C1P4. The control signal ΦS5 is inputted to the memory terminal C2P5 via switch SW5a, buffer B5 and control terminal C1P5. The control signal ΦS2 is inputted to the memory terminal C2P2 of the memory chip C2 via buffer B2 and control terminal C1P2 without passing through switches.

On the other hand, the memory control device C1 controls the memory chip C3. In this case, the internal circuit 40 of the memory control device C1 generates high-level select signal ΦCS3 and low-level select signal ΦCS2. The high-level select signal ΦCS3 is inputted to the memory terminal C3SP3 of the memory chip C3 via buffer B7 and terminal C1SP3, and thereby, the internal circuit of the memory chip C3 can be activated. By doing so, a state capable of inputting and outputting each control signal is given. In this case, the select signal ΦCS2 inputted to the memory terminal C2SP2 of the chip C2 is low level; therefore, the internal circuit of the memory chip C2 is not activated. As a result, the internal circuit of the memory chip C2 is set in a standby mode for input/output of each control signal. Simultaneously, high-level select signal ΦCS3 and low-level select signal ΦCS2 are inputted to switch circuits SW1, SW3, SW4 and SW5. By doing so, switches SW1a, SW3a, SW4a and SW5a are in a non-conductive state; on the other hand, switches SW1b, SW3b, SW4b and SW5b are in a conductive state. Thus, the control signal ΦS1 is inputted to the memory terminal C3P5 of the activated memory chip C3 via switch SW5b, buffer B5 and control terminal C1P5. Likewise, the control signal ΦS3 is inputted to the memory terminal C3P1 via switch SW1a, buffer B1 and control terminal C1P1. The control signal ΦS4 is inputted to the memory terminal C3P3 via switch SW3a, buffer B3 and control terminal C1P3. The control signal ΦS5 is inputted to the memory terminal C3P4 via switch SW4a, buffer B4 and control terminal C1P4. The control signal ΦS2 is inputted to the memory terminal C3P2 of the memory chip C3 via buffer B2 and control terminal C1P2 without passing through switches.

In this manner, control signals ΦS1 to ΦS5 outputted from the internal circuit 40 of the memory control device C1 are changed in signal sequence corresponding to terminal array sequence of memory terminals of memory chips C2 and C3. Therefore, there is no need of using interposer chips employed in the conventional case. In addition, it is possible to prevent wirings from crossing in the wiring region WR2 for connecting memory chips C1 and C2 and in the wiring region WR3 for connecting memory chips C2 and C3. Consequently, this serves to prevent complication of the wirings, and to avoid reduction of yield or quality and high cost by an increase of components and processes. The first embodiment has explained about the case where control signals ΦS1 to ΦS5 are outputted from the memory control device C1 to memory chips C2 and C3. Of course, the same effect is obtained even if data signal is inputted from memory chips C2 and C3 to the memory control device C1. In the first embodiment, select signals ΦCS2 and ΦCS3 are inputted directly to terminals C1SP2 and C1SP3 without passing through the select circuit 27a. The present invention is not limited to this embodiment, and the select signals ΦCS2 and ΦCS3 may be changed over via the select circuit 27a like control signals ΦS1 to ΦS5.

The second embodiment of the present invention will be described below with reference to FIG. 3 to FIG. 8. A memory control device C1a includes a select circuit 27b in place of the select circuit 27a built in the memory control device C1 (FIG. 2). The select circuit 27b includes selector sections C2S1 to C2S5 and C3S1 to C3S5, switch circuits SW1 to SW5, assignment information recording circuits SR1 and SR2. The switch circuits SW1 to SW5 include SW1a to SW5a and SW1b to SW5b, respectively. The select signal ΦCS2 outputted from the internal circuit 40 is inputted to each gate of NMOS transistors included in SW1a to SW5a and each gate of PMOS transistors included in SW1b to SW5b. Likewise, the select signal ΦCS3 is inputted to each gate of PMOS transistors included in SW1a to SW5a and each gate of NMOS transistors included in SW1b to SW5b. Output signals of the selector sections C2S1 to C2S5 are inputted to control terminals C1P1 to C1P5 via switches SW1a to SW5a. Along with it, output signals of the selector sections C3S1 to C3S5 are inputted to control terminals C1P1 to C1P5 via switches SW1b to SW5b. In addition, the select signal ΦCS2 outputted from the internal circuit 40 is inputted to the terminal C1SP2 via buffer B6 while the select signal ΦCS3 is inputted to the terminal C1SP3 via buffer B7.

The selector section C2S1 includes selector switches SL1 to SL5. Control signals ΦS1 to ΦS5 are inputted to the selector switches SL1 to SL5, respectively. Output nodes of selector switches SL1 to SL5 are connected in common, and connected to the switch SW1a of the switch circuit SW1. The selector section C2S1 further includes NOR gates NR1 to NR5. Pluralities of assignment information S1D1 to S1D3 outputted from the assignment information recording circuit SR1 are inputted to each of NOR gates NR1 to NR5. Outputs of NOR gates NR1 to NR5 are inputted to gates of the selector switches SL1 to SL5.

The NOR gate NR1 outputs a high-level signal when pluralities of low-level assignment information S1D1 to S1D3 are inputted. The NOR gate NR2 outputs a high-level signal when pluralities of low-level assignment information S1D1, S1D2 and high-level assignment information S1D3 are inputted. The NOR gate NR3 outputs a high-level signal when high-level assignment information S1D2, low-level assignment information S1D1 and S1D3 are inputted. The NOR gate NR4 outputs a high-level signal when high-level assignment information S1D1, pluralities of low-level assignment information S1D2 and S1D3 are inputted. The NOR gate NR5 outputs a high-level signal when pluralities of high-level assignment information S1D1, S1D3 and low-level assignment information S1D2 are inputted. Selector sections C2S2 to C2S5 individually have the same configuration as the selector section C2S1.

The select circuit 27b further includes selector sections C3S1 to C3S5 having the same configuration as the selector sections C2S1 to S2S5. The selector sections C3S1 to C3S5 are supplied (inputted) with assignment information outputted from the assignment information recording circuit SR2. Output signals of the selector sections C3S1 to C3S5 are inputted to control terminals C1P1 to C1P5 via switches SW1b to SW5b of switch circuits SW1 to SW5, respectively. Other configuration is the same as the first embodiment; therefore, the details are omitted. The foregoing selector sections C2S1 to C2S5 and C3S1 to C3S5 are one example of a first selector circuit.

The memory control device C1a selects and controls the memory chip C2. In this case, the internal circuit 40 of the memory control device C1a generates high-level select signal ΦCS2 and low-level select signal ΦCS3. The high-level select signal ΦCS2 is inputted to the memory terminal C2SP2 (not shown) of the memory chip C2 via buffer B6 and terminal C1SP2. Thus, the memory chip C2 is in a state of capable of receiving a signal inputted from the memory control device C1a. Simultaneously, high-level select signal ΦCS2 and low-level select signal ΦCS3 are inputted to switch circuits SW1 to SW5. By doing so, switches SW1a to SW5a are in a conductive state; on the other hand, switches SW1b to SW5b are in a non-conductive state. Thus, the output signals of the selector sections C2S1 to S2S5 are outputted via control terminals C1P1 to C1P5, and thereafter, inputted to memory terminals C2P1 to C2P5 of the memory chip C2, which is in a receivable state.

The selector sections C2S1 to C2S5 selects signals inputted to the memory terminals C2P1 to C2P5 of the memory chip C2 every memory terminal. Pluralities of assignment information S1D1 to S1D3, S2D1 to S2D3, S3D1 to S3D3, S4D1 to S4D3 and S5D1 to S5D3 outputted from the assignment information recording circuit SR1 are inputted to each NOR gate of the selector sections C2S1 to C2S5. The pluralities of assignment information S1D1 to S1D3, S2D1 to S2D3, S3D1 to S3D3, S4D1 to S4D3 and S5D1 to S5D3 are the following signals. These signals are used for selecting selector switches of selector sections C2S1 to C2S5 and setting signal sequence so that the signal sequence is assigned in the following manner. More specifically, control signals ΦS1 to ΦS5 determined in accordance with memory terminals C2P1 to C2P5 of the memory chip C2 are assigned to control terminals C1P1 to C1P5 of the memory control device C1a.

If a signal to be inputted to the memory terminal C2P1 is the control signal ΦS1, the assignment information recording circuit SR1 outputs all low-level pluralities of assignment information S1D1 to S1D3. In this case, only output of the NOR gate NR1 is set at high level while outputs of NOR gates NR2 to NR5 is maintained at low level. Thus, the gate of the selector switch SL1 is in a conductive state while gates of selector switches SL2 to SL5 are in a non-conductive state. In other words, the selector section C2S1 selects the control signal ΦS1, and the control signal ΦS1 is outputted from the selector section C2S1. In this embodiment, on control signal is selected from one of five kinds of control signals ΦS1 to ΦS5; therefore, assignment information has bit string composed of three bits.

Likewise, if a signal to be inputted to the memory terminal C2P2 is the control signal ΦS2, pluralities of low-level assignment information S1D1, S1D2 and high-level assignment information S1D3 are inputted to the selector section C2S2. Thus, the gate of the selector switch SL2 is in a conductive state. If a signal to be inputted to the memory terminal C2P3 is the control signal ΦS3, high-level assignment information S1D2, low-level assignment information S1D1 and S1D3 are inputted to the selector section C2S3. Thus, the gate of the selector switch SL3 is in a conductive state. If a signal to be inputted to the memory terminal C2P4 is the control signal ΦS4, high-level assignment information S1D1, pluralities of low-level assignment information S1D2 and S1D3 are inputted to the selector section C2S4. Thus, the gate of the selector switch SL4 is in a conductive state. If a signal to be inputted to the memory terminal C2P5 is the control signal ΦS5, pluralities of high-level assignment information S1D1, S1D3 and low-level assignment information S1D2 are inputted to the selector section C2S5. Thus, the gate of the selector switch SL5 is in a conductive state. In the foregoing manner, control signals ΦS1 to ΦS5 are set in signal sequence corresponding to the array sequence necessary for memory terminals C2P1 to C2P5 of the memory chip C2 in the selector sections C2S1 to C2S5.

On the other hand, the memory control device C1a selects and controls the memory chip C3. In this case, the internal circuit 40 of the memory control device C1a generates high-level select signal ΦCS3 and low-level select signal ΦCS2. The high-level select signal ΦCS3 is inputted to the memory terminal C3SP3 (not shown) of the memory chip C3 via buffer B7 and terminal C1SP3, and thereby, the memory chip C3 is in a state of capable of receiving a signal inputted from the memory control device C1a. Simultaneously, high-level select signal ΦCS3 and low-level select signal ΦCS2 are inputted to switch circuits SW1 to SW5. By doing so, switches SW1b to SW5b are in a conductive state; on the other hand, switches SW1a to SW5a are in a non-conductive state. Thus, the outputs of the selector sections C3S1 to S3S5 are outputted via control terminals C1P1 to C1P5, and thereafter, inputted to memory terminals C3P1 to C3P5 of the memory chip C3, which is in a receivable state.

Assignment information (not shown) outputted from the assignment information recording circuit SR2 is inputted to the selector sections C3S1 to C3S5 selecting a signal inputted to the memory chip C3. In accordance with the assignment information (not shown), the selector section C3S1 to C3S5 makes the same select operation as selector section C2S1 to C2S5. More specifically, in the selector section C3S1, the control signal ΦS3 is selected as the control signal outputted from the memory control device C1a. Likewise, in the selector section C3S2, the control signal ΦS2 is selected. In the selector section C3S3, the control signal ΦS4 is selected. In the selector section C3S4, the control signal ΦS5 is selected. In the selector section C3S5, the control signal ΦS1 is selected.

In the memory control device C1a sets the signal sequence described below when assigning control signals to control terminals C1P1 to C1P5 before select by switch circuits SW1 to SW5 in accordance with select signals ΦCS2 and ΦCS3. That is, the signal sequence corresponding to the memory terminal sequence of memory chips C2 and C3 selected by select signals ΦCS2 and ΦCS3 are set to selector sections C2S1 to C2S5 and C3S1 to C3S5. Even if the selected memory chip dynamically changes, signal sequence adaptable to each of memory chip C2 and C3 is previously set. Thus, it is possible to reduce access time spent for the change of selected chips.

Figure 4A:
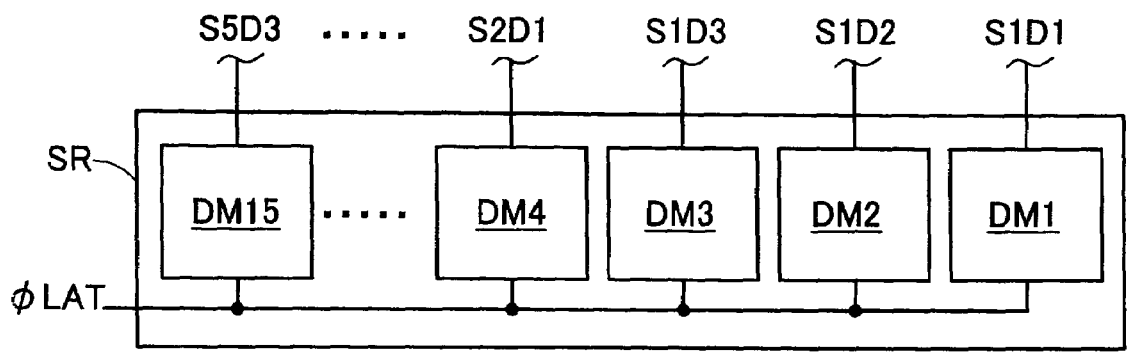
FIG. 4A is a schematic diagram of an assignment information recording circuit SR.
Figure 4B:
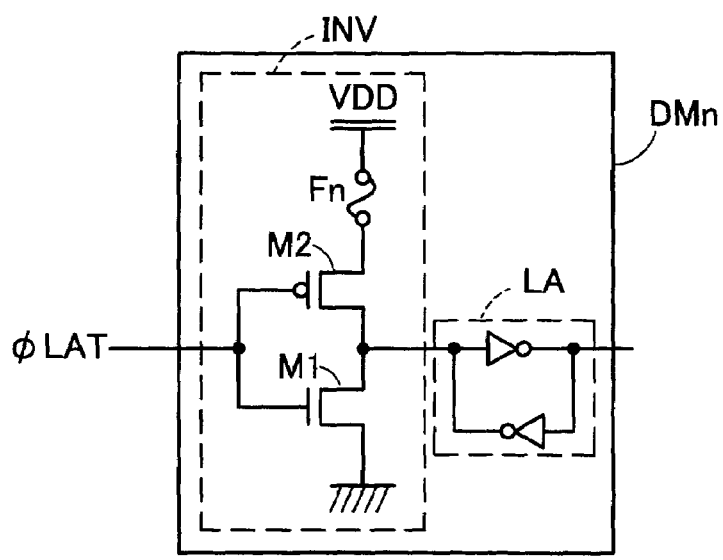
FIG. 4B is a circuit diagram of a memory section in the assignment information recording circuit of FIG. 4A.

The first configuration of assignment information recording circuits SR1 and SR2 will be explained below with reference to FIGS. 4A, 4B and FIG. 5. An assignment information recording circuit SR shown in FIG. 4A includes memory sections DM1 to DM15. The necessary number of the memory sections is determined by the number of control terminals included in the memory control device C1a and the number of control and select signals to be selected every control terminal. In this embodiment, one is selected from five kinds of control signals; therefore, assignment information has bit string composed of three bits. In addition, the memory control device C1a includes five control terminals; therefore, 15 memory sections DM1 to DM15 in total are required. As illustrated in FIG. 4B, each memory section DMn (n=1 to 15) is composed of an inverter section INV and a latch section LA. The inverter section INV includes an NMOS transistor M1 and a PMOS transistor M2. Ground voltage is applied to the source of the transistor M1 while power voltage VDD is applied to the source of the transistor M2 via a fuse Fn. A latch signal ΦLAT is inputted to each gate of transistors M1 and M2. The drains of the transistors M1 and M2 are mutually connected so a node connecting the drains of the transistors M1 and M2 is used as the output node of the inverter section INV, and connected to the latch section LA. Information latched by the latch section LA is outputted as assignment information from the memory section DMn. More specifically, outputs of memory sections DM1 to DM3 are individually outputted as pluralities of assignment information S1D1 to S1D3. Outputs of memory sections DM4 to DM6 are individually outputted as pluralities of assignment information S2D1 to S2D3. Outputs of memory sections DM7 to DM9 are individually outputted as pluralities of assignment information S3D1 to S3D3. Outputs of memory sections DM10 to DM12 are individually outputted as pluralities of assignment information S4D1 to S4D3. Outputs of memory sections DM13 to DM15 are individually outputted as pluralities of assignment information S5D1 to S5D3.

FIG. 5 shows a timing chart of the assignment information recording circuit SR. When power voltage VDD is applied to the memory control device C1a, a control circuit (not shown) inputs a pulse-like latch signal ΦLAT to memory sections DM1 to DM15. In the memory section DMn, if the fuse FN (n=1 to 15) is not cut out, a trigger signal of the latch signal ΦLAT is set to low level. In accordance with the above-mentioned operation, the output of the inverter section INV is high level. Thus, low-level assignment information S1Dn inverted by the latch section LA is outputted (arrow Y1 in FIG. 5). On the other hand, if the fuse Fn is cut out, the output of the inverter section INV is low level even if the trigger signal of the latch signal ΦLAT is set to low level. Thus, high-level assignment information S1Dn inverted by the latch section LA is outputted (arrow Y2 in FIG. 5). Consequently, the fuse Fn included in the memory section DMn is previously cut out in accordance with signal sequence corresponding to terminal array sequence of the memory chip controlled by the memory control device C1a. By doing so, every when the memory control device C1a is powered on, pluralities of assignment information S1D1 to S5D3 are outputted from memory sections DM1 to DM15.

Figure 6A:
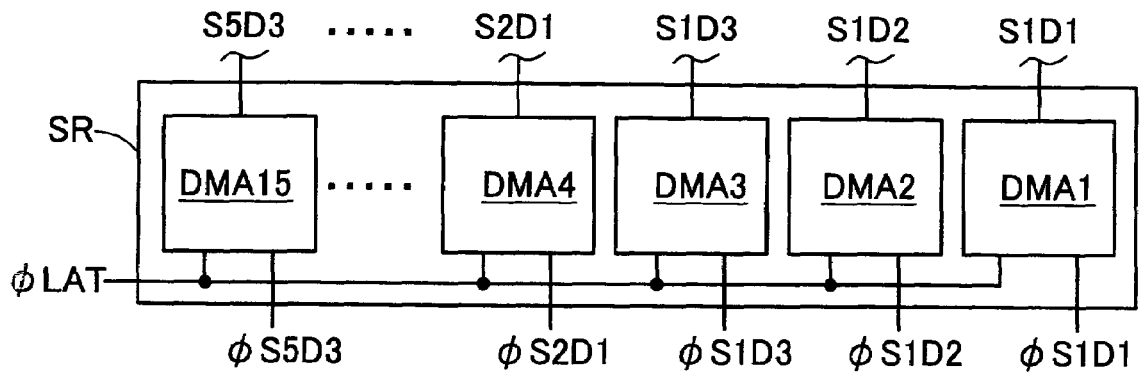
FIG. 6A is a schematic diagram of the assignment information recording circuit SR (second structural example)
Figure 6B:
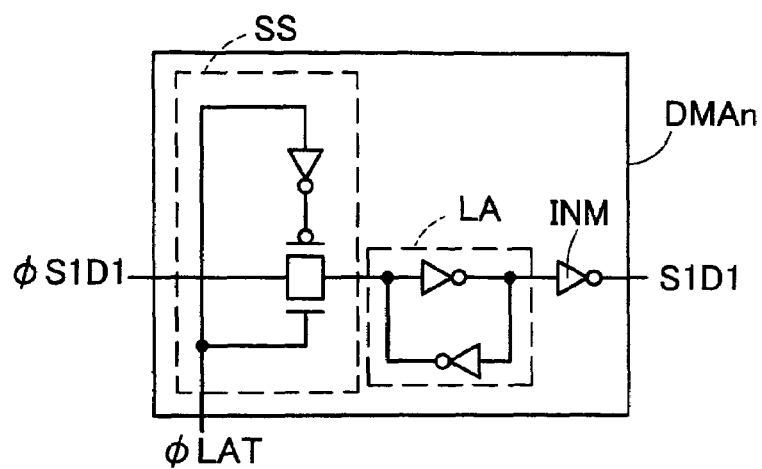
FIG. 6B is a circuit diagram of a memory section in the assignment information recording circuit of FIG. 6A.
Figure 8:
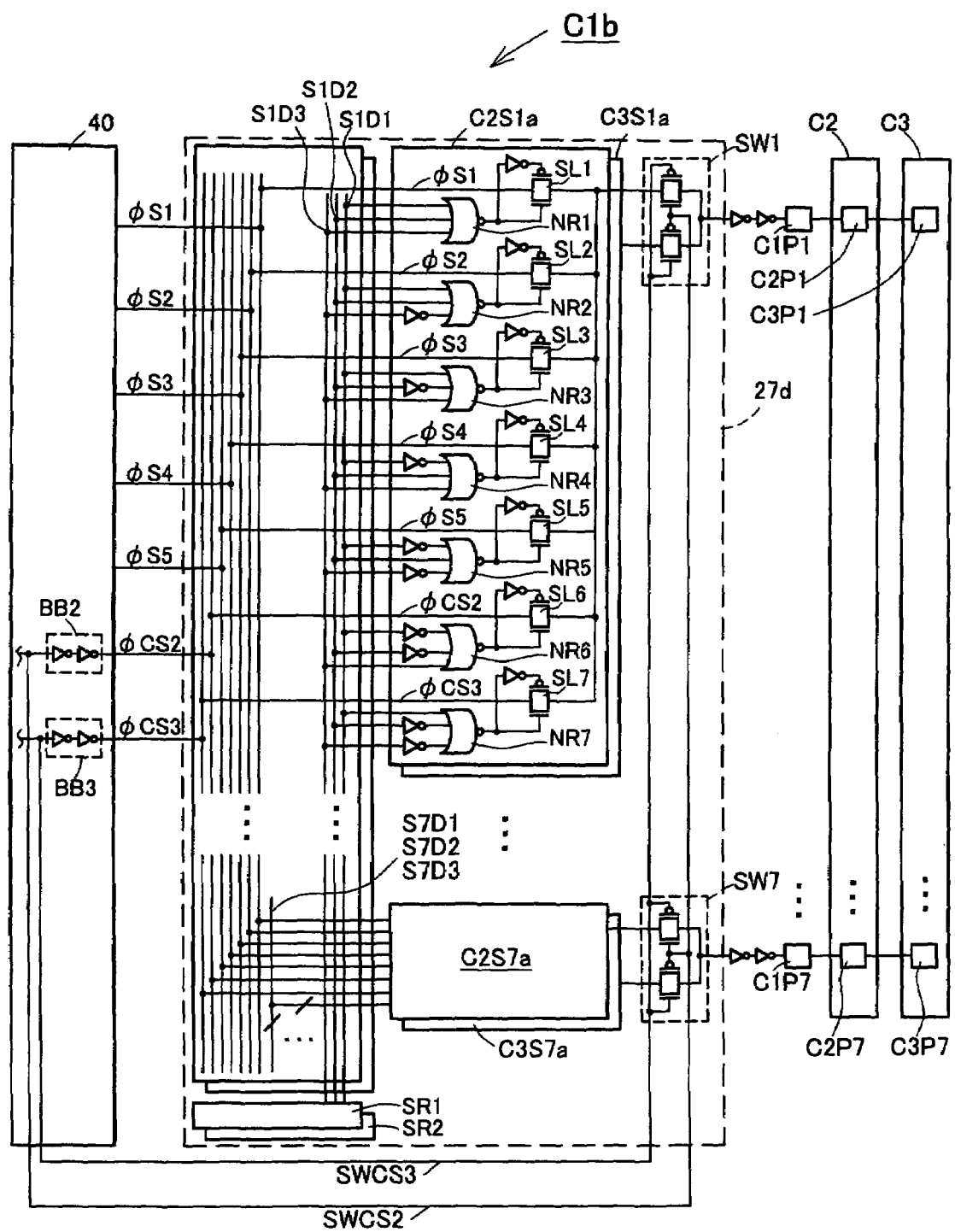

The second configuration of assignment information recording circuits SR will be explained below with reference to FIGS. 6A, 6B and FIG. 7. An assignment information recording circuit SR shown in FIG. 6A includes information latch sections DMAn (n=1 to 15). The information latch sections DMAn (n=1 to 15) shown in FIG. 6B is composed of memory switch section SS and latch section LA and inverter INM, which are connected in series. Assignment input signals ΦS1D1 to S1D3, ΦS2D1 to S2D3, ΦS3D1 to S3D3, ΦS41D1 to S4D3 and ΦS5D1 to S5D3 are inputted to the memory switch section SS. Thereafter, these assignment input signals are captured and latched by the latch section LA in accordance with latch signal ΦLAT. The latched signal is outputted from the inverter INM as assignment information S1D1 to S1D3, S2D1 to S2D3, S3D1 to S3D3, S41D1 to S4D3 and S5D1 to S5D3.

FIG. 7 shows a timing chart of the assignment information recording circuit SR having the second configuration. When power voltage VDD is applied to the memory control device C1a, a pulse-like latch signal ΦLAT is inputted to information latch sections DMA1 to DMA15. Assignment input signals ΦS1D1 to S1D3, ΦS2D1 to S2D3, ΦS3D1 to S3D3, ΦS41D1 to S4D3 and ΦS5D1 to S5D3 are inputted to the information latch sections DMA1 to DMA15 until these signals are captured and latched by the latch section LA. In the information latch section DMAn (n=1 to 15) shown in FIG. 6B, the memory switch section SS is in a conductive state while the latch signal ΦLAT is high level. In the period when the latch signal ΦLAT is high level, high-level assignment input signals ΦS1D1 to S5D3 are inputted to the information latch section DMAn. Then, pluralities of high-level assignment information S1D1 to S5D3 are captured in the latch section LA (arrow Y3 in FIG. 7). When low-level assignment input signals ΦS1D1 to S5D3 are inputted to the information latch section DMAn, low-level assignment information S1D1 to S5D3 are captured in the latch section LA (arrow Y4 in FIG. 7).

Thus, in the initial state when the memory control device C1a is powered on, assignment input signals ΦS1D1 to S1D3, ΦS2D1 to S2D3, ΦS3D1 to S3D3, ΦS41D1 to S4D3 and ΦS5D1 to S5D3 are latched by the latch section LA of the information latch section DMAn. By doing so, pluralities of assignment information S1D1 to S1D3, S2D1 to S2D3, S3D1 to S3D3, S41D1 to S4D3 and S5D1 to S5D3 are outputted from the information latch section DMAn after that.

In the manner described above, in the selector sections C2S1 to C2S5 and C3S1 to C3S5, control signals ΦS1 to ΦS5 outputted from the internal circuit 40 of the memory control device are set to the signal sequence corresponding to each terminal array sequence of memory terminals C2P1 to C2P5 and C3P1 to C3P5 of memory chips C2 and C3. Therefore, there is no need of using interposer chips employed in the conventional case. In addition, it is possible to prevent wirings from crossing in the wiring region WR2 for connecting memory control device C1 and memory chip C2 and in the wiring region WR3 for connecting memory chips C2 and C3. Consequently, this serves to prevent complication of the wirings, and to avoid reduction of yield or quality and high cost by an increase of components and processes.

As described in the principle of FIG. 1, select signals ΦCS2 and ΦCS3 are assigned in accordance with each terminal array sequence of memory chips via select circuits in addition to control signals ΦS1 to ΦS5. The following is a description on another configuration of the memory control device C1a of FIG. 3, that is, a memory control device C1b including a select circuit 27d shown in FIG. 8. The memory control device C1b includes control terminals C1P1 to C1P7. Control signals ΦS1 to ΦS5, and select signals ΦCS2 and ΦCS3 are assigned to the control terminals. The memory chip C2 includes memory terminals C2P1 to C2P7, and the memory chip C3 includes memory terminals C3P1 to C3P7. Control signals ΦS1 to ΦS5, select signals ΦCS2 and ΦCS3 are inputted/outputted to these memory chips. The select circuit 27d includes selector sections C2S1a to C2S7a, C3S1a to C3S7a and switch circuits SW1 to SW7. The internal circuit 40 outputs select signals ΦCS2 and ΦCS3 are outputted via buffers BB2 and BB3. In addition, signals before passing through these buffers, that is, switch signals SWCS2 and SWCS3 are outputted from the internal circuit 40, and inputted to switch circuits SW1 to SW7. Output signals of selector sections C2S1a to C2S7a and C3S1a to C3S7a are inputted to control terminals C1P1 to C1P7 via switch circuits SW1 to SW7. The selector section C2S1a includes selector switches SL1 to SL7. Select signals ΦCS2 and ΦCS3 are inputted to these selector switches SL1 to SL7 in addition to control signals ΦS1 to ΦS5. The selector section C2S1a further includes NOR gates NR1 to NR7. Pluralities of assignment information S1D1 to S7D3 outputted from an assignment information recording circuit SR1 are inputted to selector sections C2S1a to C2S7a. Other configuration of the memory control device C1b is the same as the memory control device C1a of FIG. 3; therefore, the details are omitted.

The memory control device C1b selects and controls the memory chip C2. In this case, high-level and low-level switch signals SWCS2 and SWCS3 are outputted from the internal circuit 40, and thereafter, inputted to switch circuits SW1 to SW7. The output terminals of selector sections C2S1a to C2S7a are in a state of being conductive with control terminals C1P1 to C1P7. The assignment information recording circuit SR1 outputs pluralities of assignment information S1D1 to S7D3. According to pluralities of assignment information S1D1 to S7D3, selector switch is selected in selector sections C2S1a to C2S7a in the following manner. The selector switch is selected so that control signals ΦS1 to ΦS5, select signals ΦCS2 and ΦCS3 are assigned in the signal sequence corresponding to memory terminals C2P1 to C2P7 of the memory chip C2. By doing so, select signals ΦCS2 and ΦCS3 are also assigned in the signal sequence corresponding to each memory terminal sequence of selected memory chips C2 and C3 in addition to control signals ΦS1 to ΦS5. The internal circuit 40 outputs select signals ΦCS2 and ΦCS3 via buffers BB2 and BB3. By doing so, it is possible to improve drive capacity of driving the select circuit 27d, and to delay output timing of select signals ΦCS2 and ΦCS3 with respect to switch signals SWCS2 and SWCS3. Therefore, the changeover of switch circuits SW1 to SW7 is securely made before the changeover operation of selector sections C2S1a to C2S7a by select signals ΦCS2 and ΦCS3 is completed.

Figure 9:
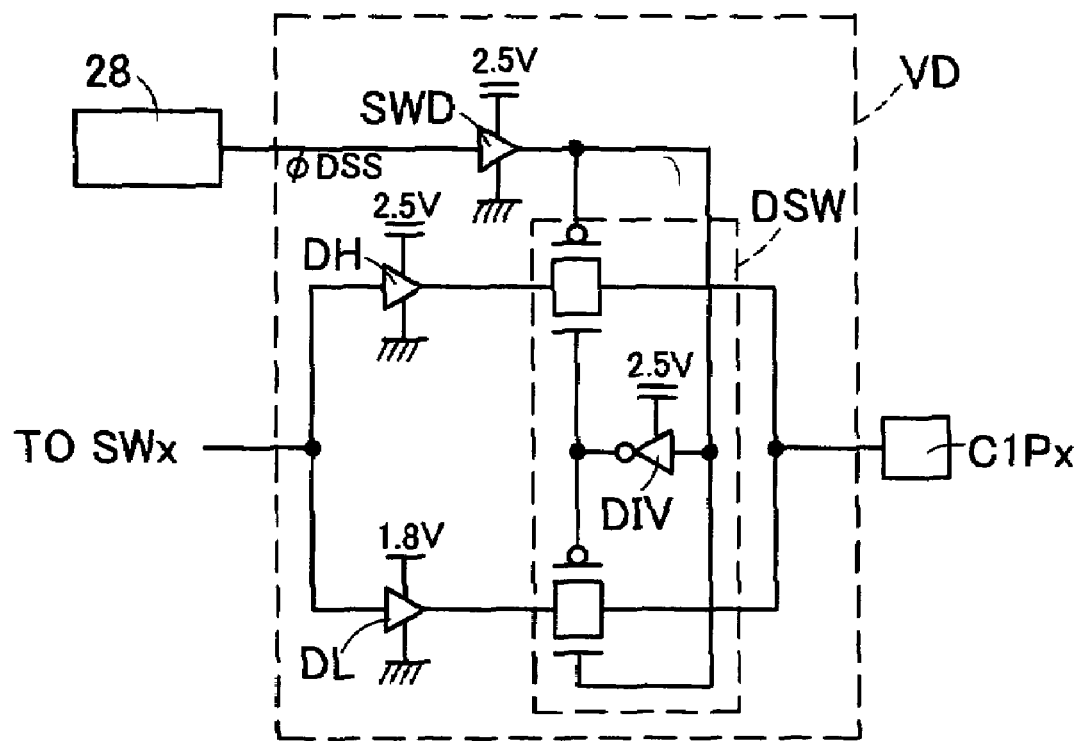
FIG. 9 is a circuit diagram of a voltage variable driver section VD directed to a third embodiment.

The third embodiment of the present invention will be explained below with reference to FIG. 9. In the third embodiment, control terminals C1P1 to C1P5 each include a voltage variable driver section VD in place with buffers B1 to B5 used in the memory control device C1 of FIG. 2. FIG. 9 shows a circuit diagram of the voltage variable driver section VD. The voltage variable driver section VD includes high voltage output driver DH, low voltage output driver DL, driver switch section DSW, and switch driver SWD. Power voltages 2.5 (V), 1.8 (V) and 2.5 (V) are supplied to high voltage output driver DH, low voltage output driver DL and inverter DIV of the driver switch section DSW, respectively. The switch driver SWD is supplied with power voltage more than the same power voltage supplied to the high voltage output driver DH. In the third embodiment, 2.5 (V) is supplied to the switch driver SWD. Output signals from switches SWx (x=1 to 5, FIG. 2) are inputted to high and low voltage output drivers DH and DL. Output signals of high and low voltage output drivers DH and DL are both inputted to a control terminal C1Px via the driver switch section DSW. A driver switch signal ΦDSS outputted from a driver switch section 28 is inputted to the driver switch section DSW via the switch driver SWD. The control terminal C1Px is connected to each memory terminal of memory chips C2 and C3 (see FIG. 2).

The following is a description on the operation when the power voltage of the memory chip C2 is 2.5 (V) and the power voltage of the memory chip C3 is 1.8 (V). The memory control device C1 (FIG. 2) selects the memory chip C2. In this case, the internal circuit 40 of the memory control device C1 inputs high-level select signal ΦCS2 to the memory terminal C2SP2 of the memory chip 2. By doing so, the memory chip C2 is activated, and set to a state capable of inputting and outputting control signal. Simultaneously, low-level driver switch signal ΦDSS is inputted from the driver switch section 28 to the drier switch section DSW. The path between high voltage output driver DH and control terminal C1Px (x=1 to 5) is in a conductive state while the path between low voltage output driver DL and control terminal C1Px is in a non-conductive state. Thus, the control signals outputted from SW1 to SW5 (FIG. 2) are driven by high voltage output driver DH, and outputted from control terminals C1P1 to C1P5 to the memory chip C2.

On the other hand, the memory control device C1 selects the memory chip C3. In this case, high-level select signal ΦCS3 is inputted to the memory terminal C3SP3 of the memory chip C3 from the internal circuit 40 of the memory control device C1. By doing so, the memory chip C3 is activated; therefore, it is in a state capable of inputting and outputting control signals. Simultaneously, high-level driver switch signal ΦDSS is inputted from the driver switch section 28 to the driver switch section DSW. Thus, the path between high voltage output driver DH and control terminal C1Px is in a non-conductive state while the path between low voltage output driver DL and control terminal C1Px is in a conductive state. Thus, the control signals outputted from SW1 to SW5 (FIG. 2) are driven by low voltage output driver DL, and outputted from control terminals C1P1 to C1P5 to the memory chip C2.

Figure 10A:
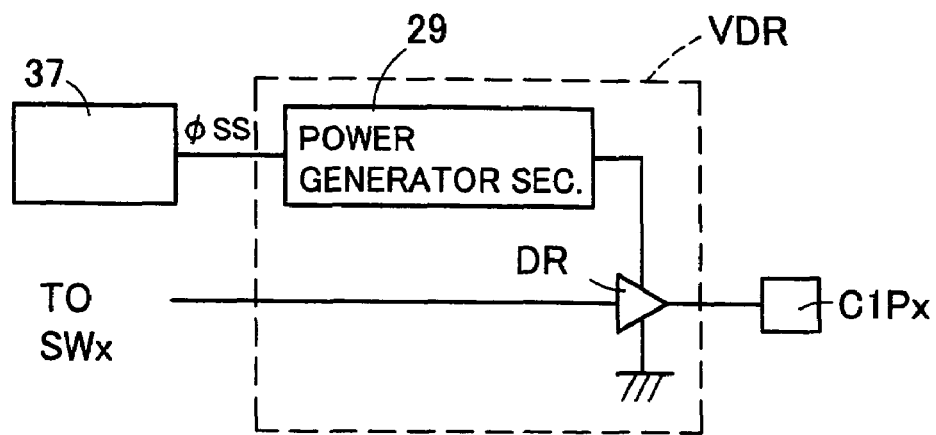
FIG. 10A is a circuit diagram of voltage variable driver section VDR directed to a fourth embodiment.
Figure 10B:
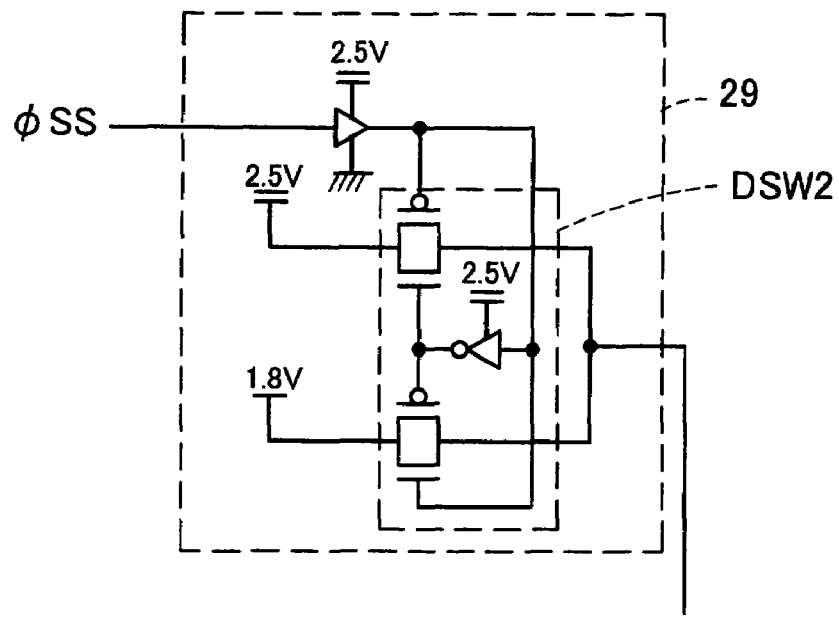
FIG. 10B is a structural example of a power generator section 29.
Figure 12:
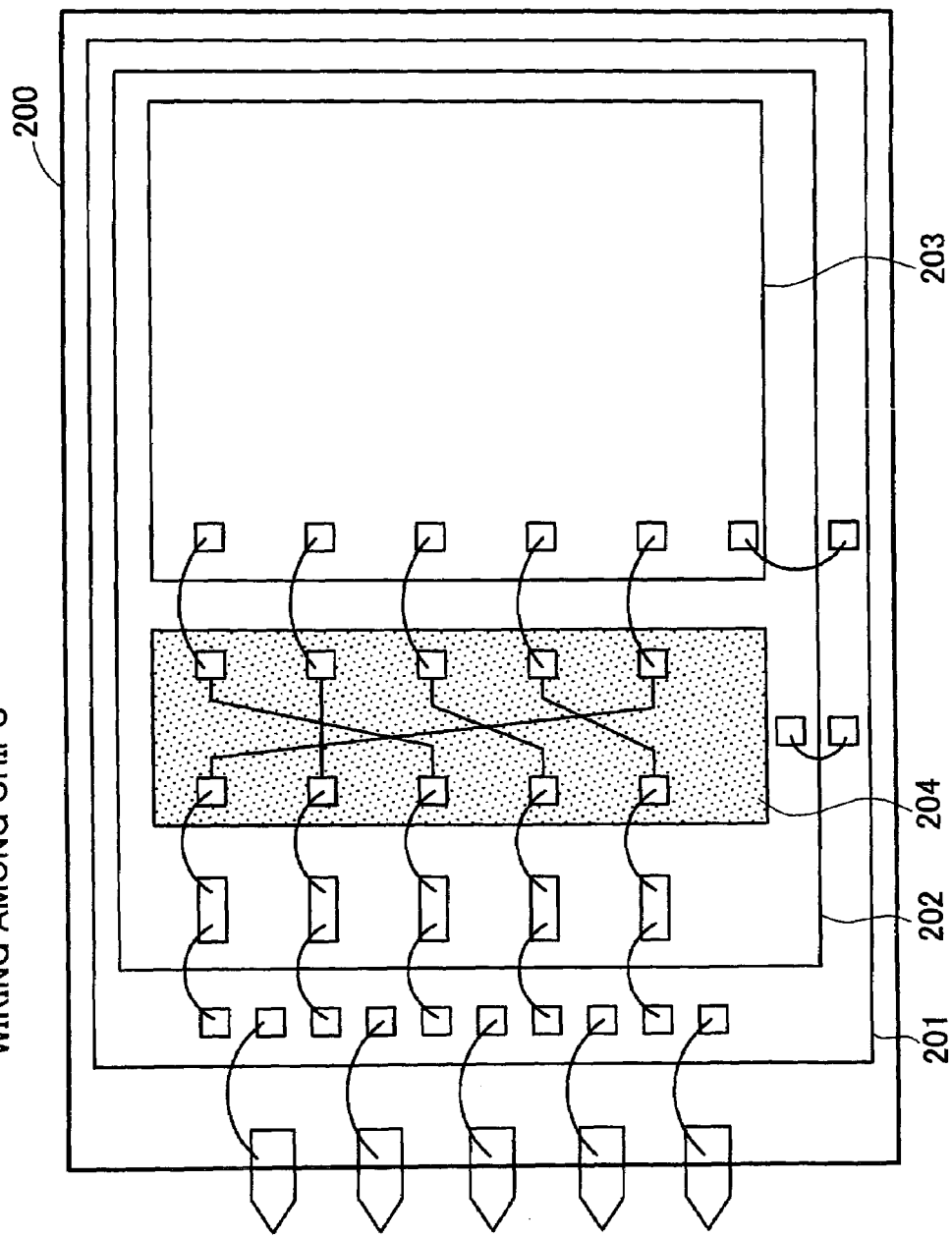
FIG. 12 is an electrical schematic diagram of conventional wiring among chips.

The fourth embodiment of the present invention will be explained below with reference to FIGS. 10A, 10B. In the fourth embodiment, a voltage variable driver section VDR is provided in place of the voltage variable drier section VD1 of the third embodiment. As shown in FIG. 10A, the voltage variable driver section VDR includes driver DR and power generator section 29. The outputs of switch SWx (x=1 to 5, FIG. 2) are inputted to control terminals C1Px via the driver DR. A power switch signal ΦSS outputted from a power switch section 37 is inputted to the power generator section 29. Power having predetermined voltage corresponding to the power switch signal ΦSS is supplied from the power generator section 29 to the driver DR. FIG. 10B shows the configuration of the power generator section 29. The configuration of the power generator section 29 is the same as the voltage variable driver section VD of FIG. 9; therefore, the details are omitted.

The following is a description on the operation when the power voltage of the memory chip C2 is 2.5 (V) and the power voltage of the memory chip C3 is 1.8 (V). The memory control device C1 (FIG. 2) selects the memory chip C2. In this case, the internal circuit 40 of the memory control device C1 inputs high-level select signal ΦCS2 to the memory terminal C2SP2 of the memory chip C2. By doing so, the memory chip C2 is activated, and set to a state capable of inputting and outputting control signal. Simultaneously, low-level power switch signal ΦSS is inputted from the power switch section 37 to the drier switch section DSW2. The path between 2.5 (V) power voltage and control terminal C1Px (x=1 to 5) is in a conductive state while the path between 1.8 (V)power voltage and control terminal C1Px is in a non-conductive state. Thus, the control signals outputted from SW1 to SW5 (FIG. 2) are driven by 2.5 (V) power voltage, and outputted from control terminals C1P1 to C1P5 to the memory chip C2.

On the other hand, the memory control device C1 selects the memory chip C3. In this case, high-level select signal ΦCS3 is inputted to the memory terminal C3SP3 of the memory chip C3, and thereby, the memory chip C3 is activated. Simultaneously, high-level power switch signal ΦSS is inputted from the power switch section 37 to the driver switch section DSW2. The path between 2.5 (V) power voltage and driver DR is in a non-conductive state while the path between 1.8 (V) power voltage and driver DR is in a conductive state. Thus, the control signals outputted from SW1 to SW5 (FIG. 2) are driven by 1.8 (V) power voltage, and outputted from control terminals C1P1 to C1P5 to the memory chip C3.

Power voltage more than higher power voltage of the memory chips C2 and C3 may be supplied to the driver. More specifically, the memory chip C3 is supplied with 1.8 (V) voltage, but it has breakdown voltage such that no fault is generated even if 2.5 (V) voltage signal is inputted thereto. Thus, even if the memory control device selects either memory chip C2 or C3, high voltage output driver DH may be always selected in the voltage variable driver section VD (FIG. 9). The foregoing 2.5 (V) Power voltage from the power generator section 29 to the driver DR may be always supplied in the voltage variable driver section VDR (FIG. 10A).

In the memory control device C1 according to the third and fourth embodiments, at least one of control signal or select signal having voltage level more than power voltage supplied to the memory chips C2 and C3. Thus, the memory chips C2 and C3 securely input high-level signal. Consequently, it is possible to prevent feedthrough current (current flowing between power voltage and ground voltage) by the input of intermediate level voltage signal lower than the power voltage supplied to the memory chips.

The fifth embodiment of the present invention will be explained below with reference to FIG. 11. As shown in FIG. 11, a memory control device CV1 includes a select circuit 27c. Control signals 31, 33, 34, select signals SV2 and SV3 inputted and outputted from an internal circuit 40a are inputted and outputted from control terminals P31, P33, P34, P36 and P37 via select circuit 27C. The control terminal P32 is connected with a power voltage supply section (not shown) for supplying power voltage VDD. The control terminal P35 is set as ground voltage VSS. In the memory chip CV3, control signals and select signals 31c, 33c, 34c, 36c and 37c inputted and outputted from an internal circuit 41 are inputted and outputted via memory terminals 31b2, 33b1, 34b1, 36b1 and 37b1. Memory terminals 31b1, 32b1 and 35b1 are connected to a power line VDD3 having power voltage VDD. Memory terminals 32b2, 33b2 and 35b2 are connected to a power line VSS3 having ground voltage VSS. Control terminals P31 to P37 of the memory control device CV1 are connected to memory terminals 31a to 37a of the memory chip CV2, respectively. Further, these control terminals P31 to P37 are connected to memory terminals 31b2, 32b1, 33b1, 34b1, 35b2, 36b1 and 37b1 of the memory chip CV3 via memory terminals 31a to 37a, respectively. The select signal SV2 is inputted to the memory terminal corresponding to the memory chip CV2 via any of control terminals P31 to P37. By doing so, the memory chip CV2 is activated while being in a signal acceptable state. Likewise, the select signal SV3 is inputted to the memory terminal corresponding to the memory chip CV3, and thereby, the memory chip CV3 is activated.

The power voltage supply section VDD1 (not shown) in the memory control device CV1 is connected to the memory terminal 32b1 via control terminal P32 and memory terminal 32a, and thereby, power voltage VDD is supplied to the power line VDD3. The ground voltage supply section VSS1 (not shown) in the memory control device CV1 is connected to the memory terminal 35b2 via control terminal P35 and memory terminal 35a, and thereby, ground voltage VSS is supplied to the power line VSS3. In this case, memory terminals 31b1, 32b2, 33b2 and 35b1 has no terminal to be connected. Here, the following is a description on the case where in the memory chip CV2, the memory terminal 32a is supplied with ground voltage VSS in place of power voltage VDD while the memory terminal 35a is supplied with power voltage VDD in place of ground voltage VSS. In this case, in the memory control device CV1, the control terminal P32 is connected with ground voltage supply section VSS 1 (not shown) in place of power voltage supply section VDD1 (not shown). The control terminal P35 is connected with power voltage supply section VDD1 (not shown) in place of ground voltage supply section VSS1 (not shown). The foregoing connection is made, and thereby, it is possible to prevent wirings from crossing between memory control device CV1 and memory chip CV2. In addition, the connection of memory terminals 32a and 32b1 is changed into the connection of memory terminals 32a and 32b2. By doing so, the ground voltage supply section VSS1 is connected to the power line VSS3 via control terminal P32, memory terminals 32a and 32b2. Likewise, the connection of memory terminals 35a and 35b2 is changed into the connection of memory terminals 35a and 35b1. By doing so, the power voltage supply section VDD1 is connected to the power line VDD3 via control terminal P35, memory terminals 35a and 35b1. In the same manner as the first and second embodiments, the select circuit 27c is operated in accordance with select signals SV2 and SV3. Thus, control signals 31, 33, 34, select signals SV2 and SV3 outputted from the internal circuit 40a of the memory control device CV1 are changed in signal sequence corresponding to terminal array sequence of memory terminals of memory chips CV2 and CV3.

By doing so, terminals of the memory chip CV3 supplied with power and ground voltage VDD and VSS can be changed in signal sequence corresponding to terminal array sequence supplying power and ground voltage VDD and VSS in the memory control device CV1. In addition, control signals 31, 33, 34, select signals SV2 and SV3 outputted from the internal circuit 40a of the memory control device CV1 can be changed in signal sequence corresponding to terminal array sequence of memory terminals of memory chips CV2 and CV3. Consequently, there is no need of using the interposer chip employed in the conventional case. In addition, it is possible to prevent wirings from crossing in the wiring region WR4 for connecting memory chips CV2 and CV3.

Here, power and ground voltage supply sections VDD1 and VSS1 (not shown) are changed via the select circuit 27c of the memory control device CV1, and thereafter, are connected to memory chips CV2 and CV3. In this case, it is possible to prevent wirings from crossing in the wiring region WR4. However, resistance element existing in the select circuit 27c give influence to voltage; for this reason, the voltage varies. As a result, there is a possibility of causing a problem that the memory chips has malfunction. In order to reduce the resistance component existing in the select circuit 27c, switch devices used for changeover is made large; for this reason, this is severe problem. However, the configuration shown in FIG. 11 is employed, and thereby, power and ground voltage supply sections VDD1 and VSS1 has no need of using interposer such as select circuit 27c. In addition, no changeover operation by the select circuit 27c is made. Therefore, it is possible to prevent voltage from receiving influence by resistance component existing in the select circuit 27c, and thus, to solve the above-mentioned problem.

The present invention is not limited to the foregoing embodiments, and of course, various improvements and modifications may be possible within the scope without diverging from the spirit and concept of the invention. In the first embodiment (FIG. 2) of the present invention, chips controlled by the memory control device C1 are memory chips C2 and C3. In this case, the chips controlled by the memory control device C1 may be three or more. If the controlled memory chip is single, control signals ΦS1 to ΦS5 outputted from the internal circuit 40 of the memory control device C1 are assigned in signal sequence corresponding to terminal array sequence of memory terminals of the memory chip. By doing so, it is possible to prevent wirings from crossing in connection between chips; therefore, of course, the same effect as described the present invention is obtained.

In the second embodiment (FIG. 3) of the present invention, the select circuit 27b is composed of selector sections C2S1 to C2S5, C3S1 to C3S5, switch circuits SW1 to SW5, assignment information recording circuits SR1 and SR2. The select circuit 27b is not limited to the foregoing configuration. For example, the select circuit 27b may be composed of selector sections and assignment information recording circuits without using switch circuits. In accordance with select signals of memory chips, the assignment information recording circuits output assignment information. By doing so, control signals are assigned to control terminals in the sequence of memory terminals of the memory chip selected by the selector section. Therefore, there is no need of using switch circuits. In addition, there is no need of providing selector sections corresponding to the number of connected memory chips; therefore, it is sufficient to provided selector sections corresponding to the number of control terminals. Consequently, it is possible to prevent the chip size of the memory control device C1a from increasing. The foregoing circuit configuration is given as one example of the second selector circuit.

In the assignment information recording circuit SR (FIG. 6A) including information latch section DMAn, the following modification may be made. More specifically, every when the memory control device C1a selects different memory chip, assignment input signal corresponding to the selected memory chip is inputted to the assignment information recording circuit SR. By doing so, there is no need of providing assignment information recording circuits SRn corresponding to the number of connected memory chips. Thus, it is sufficient if one assignment information recording circuits SRn is provided; therefore, it is possible to prevent the chip size of the memory control device C1a from increasing.

The third embodiment (FIG. 9) of the present invention has explained about the case where the voltage supplied to high and low voltage output drivers DH and DL is the same as the power voltage of memory chips C2 and C3. The present invention is not limited the above-mentioned case. For example, the high voltage output driver DH is supplied with 2.5 (V) while the low voltage output driver DL is supplied with 1.8 (V). In this case, if higher power voltage of memory chips C2 and C3 is a range from 1.8 (V) or more to 2.5 (V) or less, the high voltage output drier DH is selected. If higher power voltage of memory chips C2 and C3 is 1.8 (V) or less, the low voltage output drier DL is selected.

Memory control devices C1 (FIG. 2) and C1a (FIG. 3) output control signals ΦS1 to ΦS5 to memory chips C2 and C3. The present invention is not limited to the above-mentioned configuration. In this case, data signals may be of course inputted from memory chips C2 and C3 to memory control devices C1 and C1a.

According to the memory control device and memory control method of the present invention, the following effect is obtained. At least one of control signals or select signals outputted from the internal circuit of the memory control device is set in signal sequence corresponding to terminal array sequence of several memory terminals in several semiconductor memory devices. Therefore, it is possible to prevent wirings from crossing in the wiring region for connecting memory control devices and semiconductor memory devices and in the wiring region for mutually connecting semiconductor memory devices. Consequently, this serves to prevent complication of the wirings, and to avoid reduction of yield or quality and cost overrun by an increase of components and processes. In addition, even if different chips are combined, assignment information is changed, and thereby, connection is readily made.

What is claimed is:

1. A semiconductor chip comprising:
    an external terminal that outputs an output signal outside the chip;
    an internal circuit that outputs a first signal or a second signal that is different from the first signal;
    a recoding circuit configured to store an information;
    a select circuit, coupled to the external terminal and coupled to receive the first and second signals the select circuit transmitting, to the external terminal, either the first signal or the second signal based upon the information;
    a first output driver circuit that is supplied a first power voltage for the first signal; and
    a second output driver circuit that is supplied a second power voltage which is different from the first voltage for the second signal;
    wherein the first signal, through the first output driver circuit, or the second signal, through the second output driver circuit, is outputted as the output signal via the external terminal based upon the information.

2. The semiconductor chip according to claim 1, wherein the recoding circuit includes a latch circuit.

3. The semiconductor chip according to claim 2, wherein the latch circuit stores the information during an initialization period.

4. The semiconductor chip according to claim 1, wherein the recoding circuit comprises a nonvolatile section and a latch section.

5. A semiconductor device for transmitting signals to a semiconductor memory device, the semiconductor device comprising:
    a plurality of external terminals that is inputted or outputted the signals;
    a internal circuit that selects the semiconductor memory device and transmit the signals to the semiconductor memory device;
    a select circuit for switching the signals to one of the plurality of external terminals based on a select signal corresponding to the selected semiconductor memory device;
    a plurality of output drivers to which different levels of power voltages are supplied; and
    a driver switch circuit that selects one of the plurality of output drivers which power voltage level is the same as or higher than the power voltage of the semiconductor memory device.

6. A semiconductor device according to claim 5, wherein the plurality of external terminals is provided in common, for a plurality of semiconductor memory devices which have a different arrangement of a external memory terminal.

7. A semiconductor device according to claim 5, wherein the signal is outputted from the respective external terminal via the selected output driver.

8. A semiconductor device for transmitting signals to a semiconductor memory device, the semiconductor device comprising:
    a plurality of external terminals that is inputted or outputted the signals;
    a internal circuit that selects the semiconductor memory device and transmit the signals to the semiconductor memory device;
    a select circuit for switching the signals to one of the plurality of external terminals based on a select signal corresponding to the selected semiconductor memory device;
    a plurality of output drivers to which different levels of power voltages are supplied; and
    a driver switch circuit that selects one of the plurality of output drivers which power voltage level corresponds to the selected semiconductor memory device.

9. A semiconductor device according to claim 8, wherein the plurality of external terminals is provided in common for a plurality of semiconductor memory devices which have a different arrangement of a external memory terminal.

10. A semiconductor device according to claim 8, wherein the driver switch circuit selects one of the plurality of output drivers based on a driver switch signal.

11. A semiconductor device according to claim 8, wherein the internal circuit selects the memory device based on the select signal.

12. A semiconductor device according to claim 8,
    wherein the internal circuit selects the memory device based on the select signal.

13. A semiconductor device for transmitting signals to a semiconductor memory device, the semiconductor device comprising:
    a plurality of external terminals that is inputted or outputted the signals;
    a internal circuit that selects the semiconductor memory device and transmit the signals to the semiconductor memory device;
    a recording circuit which records assignment information of the signals corresponding to the selected semiconductor device; and
    a select circuit for assigning the signals to one of the plurality of external terminals based on a select signal corresponding to the selected semiconductor memory device and the assignment information.

* * * * *